(12) United States Patent
Spitz et al.

(10) Patent No.: US 8,350,378 B2
(45) Date of Patent: Jan. 8, 2013

(54) PRESS-FIT POWER DIODE

(75) Inventors: Richard Spitz, Reutlingen (DE); Alfred Goerlach, Kusterdingen (DE); Karin Hamsen, Tuebingen (DE); Jochen Dietrich, Ulm (DE)

(73) Assignee: Robert Bosch GmbH, Stuttgart (DE)

( * ) Notice: Subject to any disclaimer, the term of this patent is extended or adjusted under 35 U.S.C. 154(b) by 873 days.

(21) Appl. No.: 10/575,526

(22) PCT Filed: Nov. 8, 2004

(86) PCT No.: PCT/DE2004/002463
§ 371 (c)(1),
(2), (4) Date: Dec. 8, 2006

(87) PCT Pub. No.: WO2005/048344
PCT Pub. Date: May 26, 2005

(65) Prior Publication Data
US 2007/0105454 A1  May 10, 2007

(30) Foreign Application Priority Data

Nov. 10, 2003 (DE) .................................. 103 52 852

(51) Int. Cl.
*H01L 23/04* (2006.01)
(52) U.S. Cl. ........ 257/698; 257/678; 257/688; 257/699; 257/706; 257/E23.101

(58) Field of Classification Search .................. 257/706, 257/E23.101, 698
See application file for complete search history.

(56) References Cited

U.S. PATENT DOCUMENTS

| 6,060,776 A * | 5/2000 | Spitz et al. .................... 257/706 |
| 6,160,309 A | 12/2000 | Le et al. |
| 6,559,529 B2 | 5/2003 | Torti et al. |
| 2002/0145189 A1 | 10/2002 | Torti et al. |

FOREIGN PATENT DOCUMENTS

| DE | 43 41 269 | 6/1995 |
| DE | 195 49 202 | 7/1997 |
| FR | 2 453 500 | 10/1980 |
| JP | 2001 68592 | 3/2001 |

* cited by examiner

*Primary Examiner* — Lynne Gurley
*Assistant Examiner* — Hsin-Yi Hsieh
(74) *Attorney, Agent, or Firm* — Kenyon & Kenyon LLP

(57) ABSTRACT

A diode, e.g., a press-fit power diode for a rectifier in a motor vehicle, includes a semiconductor chip which is connected to a head wire and a base via solder layers. A plastic sheathing, which is situated at least in the chip area and includes a plastic sleeve, enables a hard casting compound to be used and establishes a mechanical connection between the base and the head wire and forms a housing together with the base. An undercut, which extends into the casting compound, and a gap between the sleeve and the edge of the base achieve a compact design. Bevels provided on both sides enable the diode to be pressed into the rectifier from two sides.

10 Claims, 7 Drawing Sheets

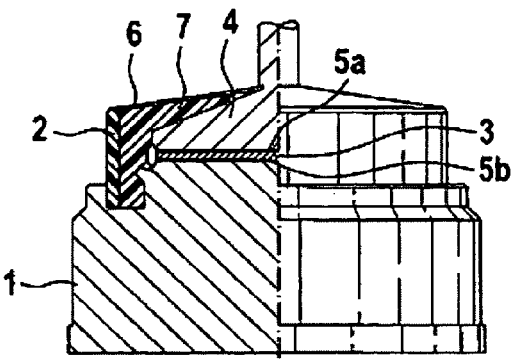
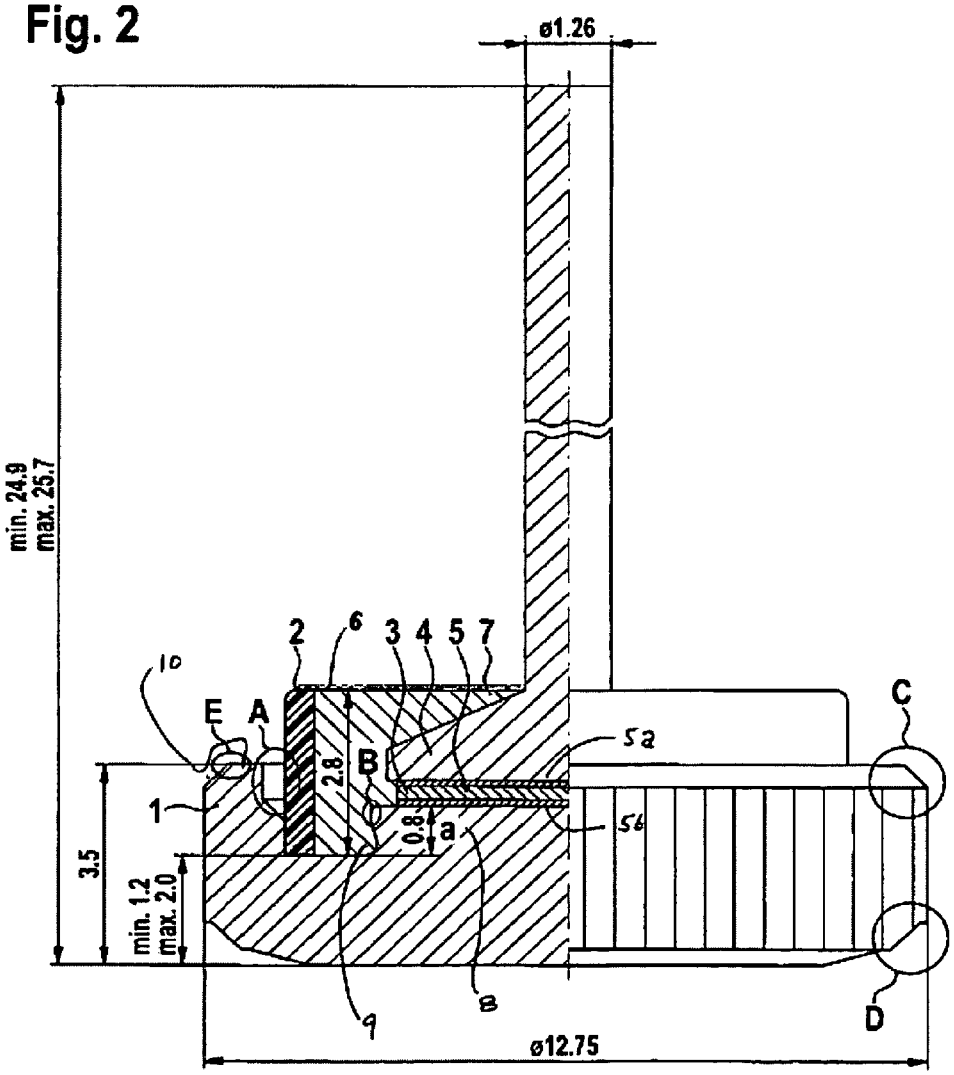

Detail X

Detail Y
M20:1

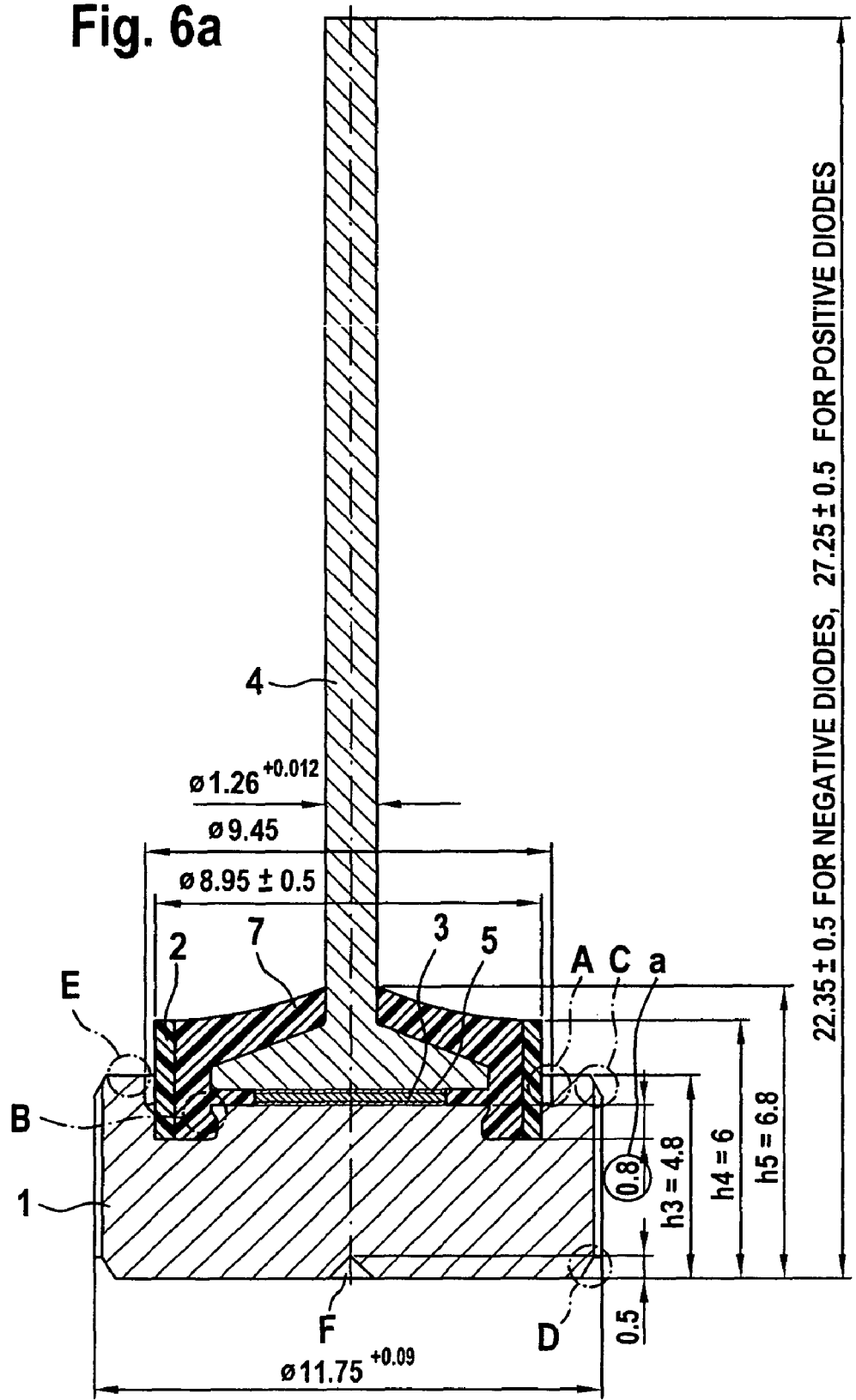

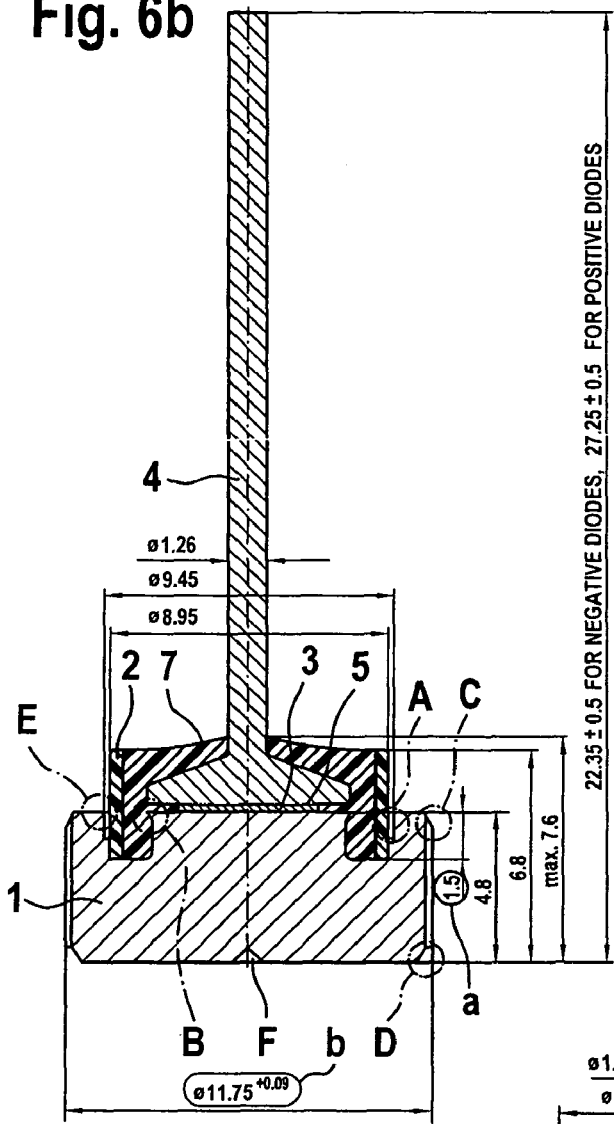
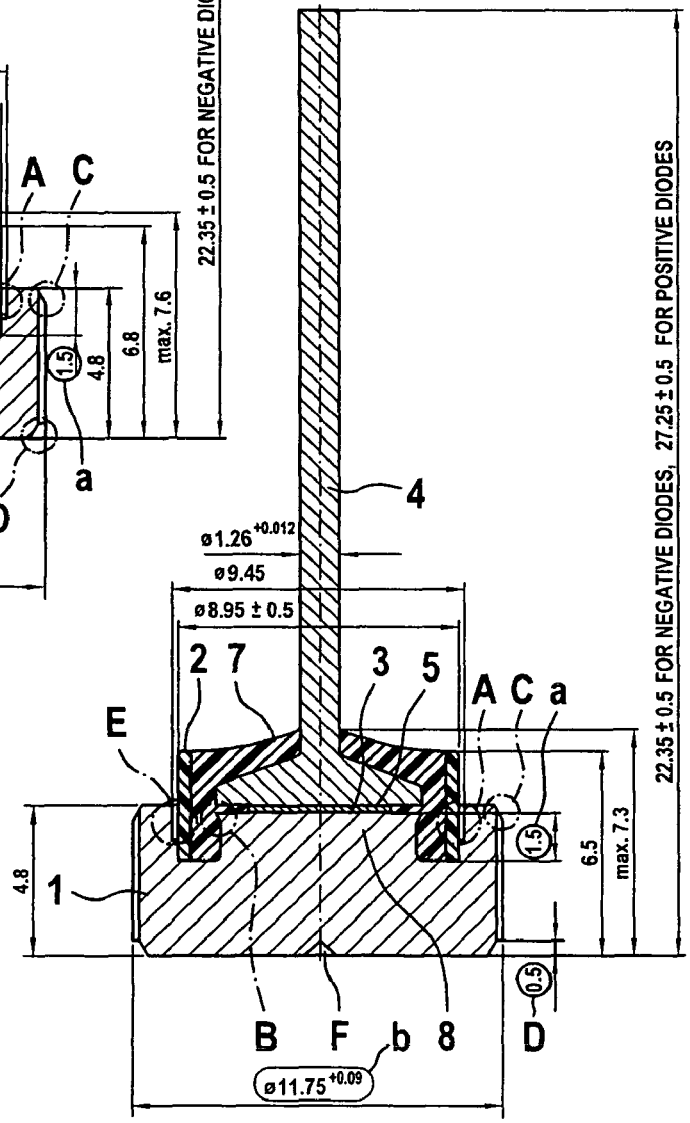

PRESS-FIT POWER DIODE

FIELD OF THE INVENTION

The present invention relates to a diode, in particular a high-power press-fit diode for a rectifier in a motor vehicle.

BACKGROUND INFORMATION

Diodes are customarily used to rectify alternating currents; this is also true for rectifiers in motor vehicles, in which a rectifier bridge having a total of six power diodes is used to rectify the output currents supplied by a three-phase alternator. These power diodes are, for example, press-fit diodes, these being diodes which are pressed into a mount and thereby connected thereto.

Press-fit diodes for motor vehicle rectifiers are described, for example, in published German Patent documents DE 43 41 269 and DE 195 49 202. These publications describe the basic design features of plastic-sheathed press-fit diodes. These press-fit diodes include a chip which is connected to a head wire and a base via solder layers. The head wire and base are surrounded by a plastic sheathing which establishes a mechanical connection. The base includes a press-fitting area which deforms slightly when the diode is pressed into the rectifier.

FIG. 1 shows an example of a plastic-sheathed diode described in published German Patent document DE 195 49 202. The diode includes mainly a base 1, a sheath 2 and a chip 3 which is situated between base 1 and head wire 4. Chip 3 is permanently connected to both base 1 and head wire 4 via solder 5a, 5b. Parts of the diode may be coated with lacquer 6. A plastic sheathing 7 provides a mechanical grip and thus also establishes a permanent mechanical connection between base 1 and head wire 4.

The basic structure of a diode described above, for example a power diode which is pressed into a rectifier for a three-phase alternator in a motor vehicle, differs only slightly from other known diodes, e.g., press-fit diodes. However, the known diodes having this structure require a mounting height of at least 8 mm. Accordingly, there is a need for a flatter design that enables the diode to be used in generator constructions in which there is not enough space for mounting heights of more than 8 mm.

In this regard, other flat power diodes are known which have a mounting height of only 4 mm. These flat diodes include a housing having a cup-like shape which permits the reduced mounting height. When such known cup-type diodes are pressed into the rectifier sheet, the edge of the housing is inevitably deformed toward the inside, due to the press fitting between the diode and press-fit block, and presses upon the plastic sheathing protecting the chip.

To absorb or cushion this deformation, the plastic sheathing in such a known cup-type diode is made of a rubber-like soft casting compound, for example filled silicone. This results in the disadvantage that any tensile loads which may be present act directly upon the solder connecting the chip to the base and head wire, or upon the chip itself. To solve this problem, a strain relief may be provided in the head wire, which makes handling difficult during processing and requires additional operations. In addition, the elastic sheathing does not provide secure clamping of the diode base and head wire without additional measures, so that the solder and chip are not relieved by the sheathing in the event of temperature changes. Under some circumstances, this may result in a shorter diode life.

SUMMARY OF THE INVENTION

The diode according to the present invention has the advantage that only a minimal mounting height is required, and the diode may be especially easily pressed into the rectifier. In addition, a longer service life is achieved in the event of temperature changes, and a higher mechanical sturdiness is ensured. These advantages are achieved by configuring the diode in such a way that at least one gap is provided which enables deformation to take place during press-fittingly and reduces or avoids resulting mechanical forces. The fact that the diode is press-fittable on both sides and includes a hard casting compound is particularly advantageous.

It is advantageous that the diode, in particular the press-fit diode, includes a chip which is connected via solder layers to a first part (head wire) and to a second part (base), and is surrounded by a plastic sheathing which is provided at least in the chip region and forms a mechanical connection. The second part, i.e., the base, forms a part of a housing which at least partially encloses the plastic sheathing, with at least one undercut being provided for fixation. The housing or base is advantageously made of an electrically and/or thermally conductive material. The height of the base is advantageously selected to achieve adequate clamping of the base and head wire, and it is advantageously at least 0.5 mm to 0.8 mm.

The housing may have bevels or lead-in chamfers in the press-fitting area which enable the diodes to be pressed into a rectifier on both sides. In an advantageous example embodiment, the plastic sheathing between the housing and the chip is made of at least one sleeve and a sub-area filled with a casting compound. The housing forms a cup edge having a first inner diameter and an area having a reduced inner diameter.

The gap may be advantageously adjusted to the specific requirements; this applies equally to its width, depth and shape. In an advantageous example embodiment, a gap having an approximately uniform width is provided, and another advantageous example embodiment provides a v-shaped gap whose width decreases in the direction of the bottom of the base.

BRIEF DESCRIPTION OF THE DRAWINGS

FIG. 1 shows a conventional diode.
FIG. 2 shows an overall view of a diode according to the present invention.
FIGS. 5 and 6a through 6c show further example embodiments of the diodes according to the present invention.

DETAILED DESCRIPTION

Figure 3:
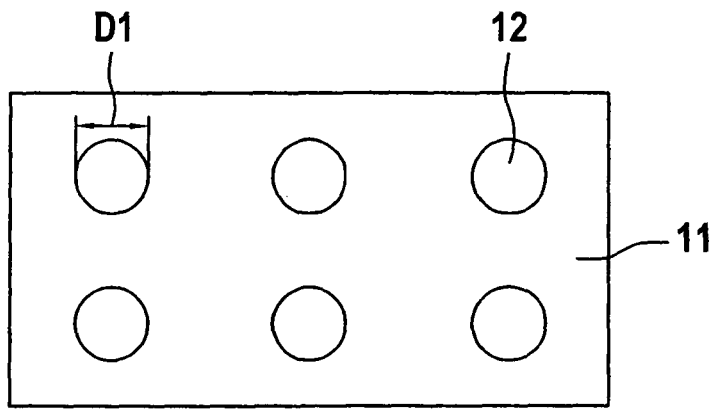
FIG. 3 shows details of the diode base.

In the case of diodes according to the present invention, the structure of a conventional diode illustrated in FIG. 1 is modified. FIG. 2 shows an exemplary embodiment of a plastic-sheathed diode according to the present invention. The diode also includes a base 1, a sleeve 2 and a chip 3 which is situated between base 1 and head wire 4. In the area of chip 3, base 1 has a rotationally symmetrical pedestal 8 which rises above a trench 9 by a height a. Edge 10 is situated on the outer area of base 1 in a rotationally symmetrical manner. Chip 3 is permanently bonded to both base 1 and head wire 4 via solder 5a, 5b. Parts of the diode, for example the outside of chip 3, may be coated with lacquer 6, the lacquer coating constituting an optional feature. A plastic sheathing 7 provides a mechanical grip and thus also establishes a permanent mechanical bond between base 1 and head wire 4.

In the exemplary embodiment of a diode according to the present invention illustrated in FIG. 2, at least one or more of the components base 1, sleeve 2, chip 3, head wire 4, solder 5, lacquer 6 and/or plastic sheathing 7 are modified or specified compared to the conventional embodiment illustrated in FIG. 1, so that the advantages specified according to the present invention are obtained. Base 1, sleeve 2 and plastic sheathing 7 form a housing, known as the M housing.

For reasons of good electrical conductivity and, at the same time, good thermal conductivity, base 1 is made of high-purity copper. An undercut B is also provided during the manufacture of the base to ensure secure fixation. Undercut B is provided in the area of pedestal 8 and may be designed, for example, as a circumferential collar. The dimensioning must be selected so that the dimension of height a is large enough to provide sufficient space for base 1 and head wire 4 to be clamped by plastic sheathing 7. In the exemplary embodiment, this space is 0.8 mm; however, only a minimum of 0.5 mm is required. A smaller dimension may, under some circumstances, result in a shorter service life in the case of thermal shock stress.

In the upper base area, the inner diameter of the "cup edge" or pedestal 8 increases due to undercut B, thereby, in the assembled state, creating a clearance between mounted sleeve 2 and the edge of the base. The upper and lower edges have bevels or lead-in chamfers C and D which facilitate insertion during assembly. To ensure solderability, a nickel layer is applied without current to the copper surface of base 1.

Sleeve 2 is designed, for example, in the shape of a cylinder and is made of polyester, for example PET or PBT, and serves as a mold for the plastic sheathing, which is made, for example, of quartz-filled epoxy. Sleeve 2 seals the lower diode area and has essentially the same structure as in the conventional diodes according to FIG. 1. The sleeve is press-fitted during the manufacture of the diode, after the base and diode head have been assembled and soldered. Cylindrical sleeve 2 in this exemplary embodiment (FIG. 2) has a slightly larger outer diameter than the cup area of base 1.

Chip 3 is a semiconductor chip which, depending on the electrical requirements, has at least one pn junction and thus performs a diode function. However, a Zener diode function, a transistor function or another function known in semiconductor technology may also be implemented.

Head wire 4 has the same shape and function as the head wire of a conventional press-fit diode, for example the press-fit diode according to FIG. 1. The size, in particular the diameter, may be adjusted to the chip size or chip supporting surface of the base. The diameter of the head wire plate should be smaller than the diameter of the chip support of the base. The material and surface are identical to the material of base 1, which means the material is, in particular, copper which has been further plated, if necessary, with nickel.

A solder which is customarily used in the manufacture of press-fit diodes or power diodes for vehicle rectifiers is used as solder 5a, 5b.

Lacquer 6, which may be applied to the outer area of the chip, but is not absolutely necessary, has a composition that is customary in semiconductor technology.

Plastic sheathing 7 is implemented as a hard casting and made from a quartz-filled epoxy.

In contrast to the conventional cup-type diodes in which hard casting is not possible, a hard casting of this type may be provided for the diode according to FIG. 2. In the case of cup-type diodes, cracks which produce leakage in the sheathing occur when the diode is pressed into the rectifier, due to the edge deformation and resulting force upon the casting compound. A crack formation of this type is avoided by inserting a plastic sleeve 2 as the mold for the hard casting compound. The clearance or gap A, which occurs between plastic sleeve 2 and pedestal 8 of base 1, prevents a harmful force from being produced on the hard casting compound as a result of the deformation of the copper edge during press-fitting. For this purpose, gap A must be at least as wide as the difference between diameter D1 of the press-fit hole 12 in rectifier 11 (shown in FIG. 3) and diameter of the diode. For example, width of the gap A is approximately 0.1 mm. Gap A causes base 1 to form an edge 10 having a first inner diameter and an area having a reduced inner diameter.

Bevels or lead-in chamfers C and D are provided on the top and bottom for the purpose of press-fitting the diode on both sides. The diode is thus pressable into rectifier 11 either from below or from above, using an annular die which is not illustrated. During press-fitting from above, annular surface E serves as the contact surface for the press-fitting die.

FIG. 3 shows a schematic representation of rectifier 11; it includes six press-fit holes 12, each having a diameter of D1, into which the diodes are to be pressed. Following suitable electrical interconnection, the six diodes then form the rectifier.

Figure 4A:
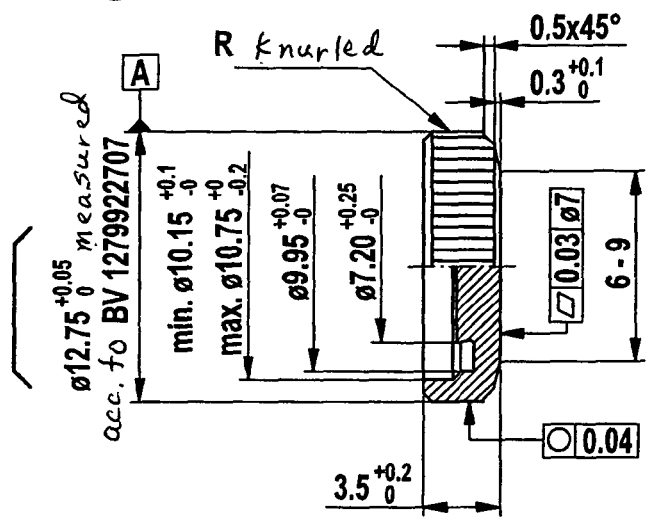
FIG. 4 shows a schematic representation of a rectifier having holes for the diodes to be press-fit.
Figure 4B:
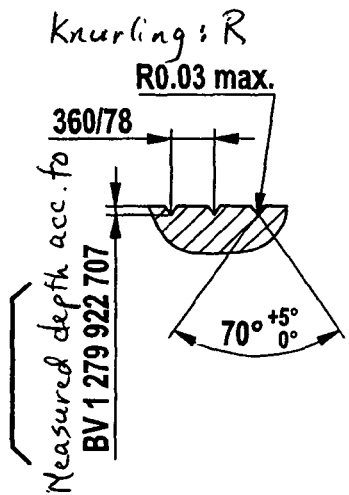
Figure 4C:
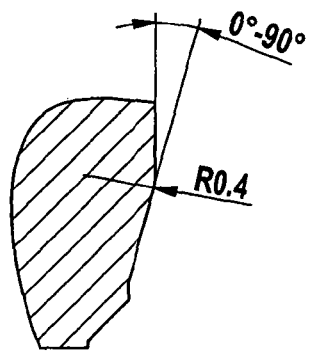
Figure 4D:
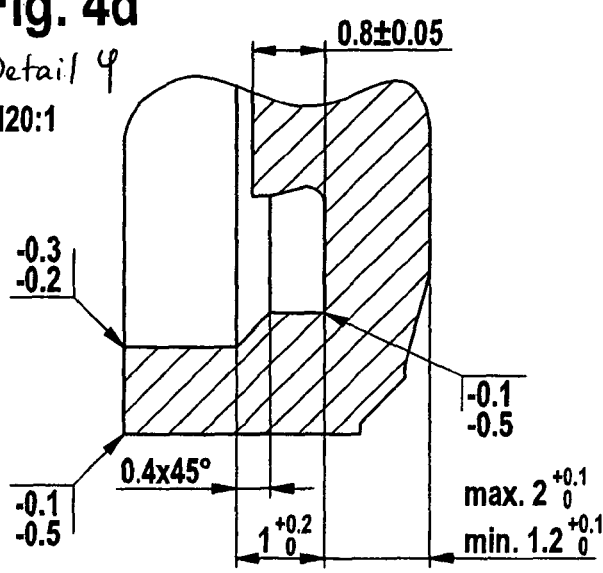

FIGS. 4a through 4d show further details of the design of the diode base in the exemplary embodiment according to FIG. 2. FIG. 4a shows the entire base with reference to details X (FIG. 4c), Y (FIG. 4d) and knurling R (FIG. 4b), which serves to improve the press-fitting performance. Detail X shows one of the bevels and detail Y the area containing the slot.

Figure 5:
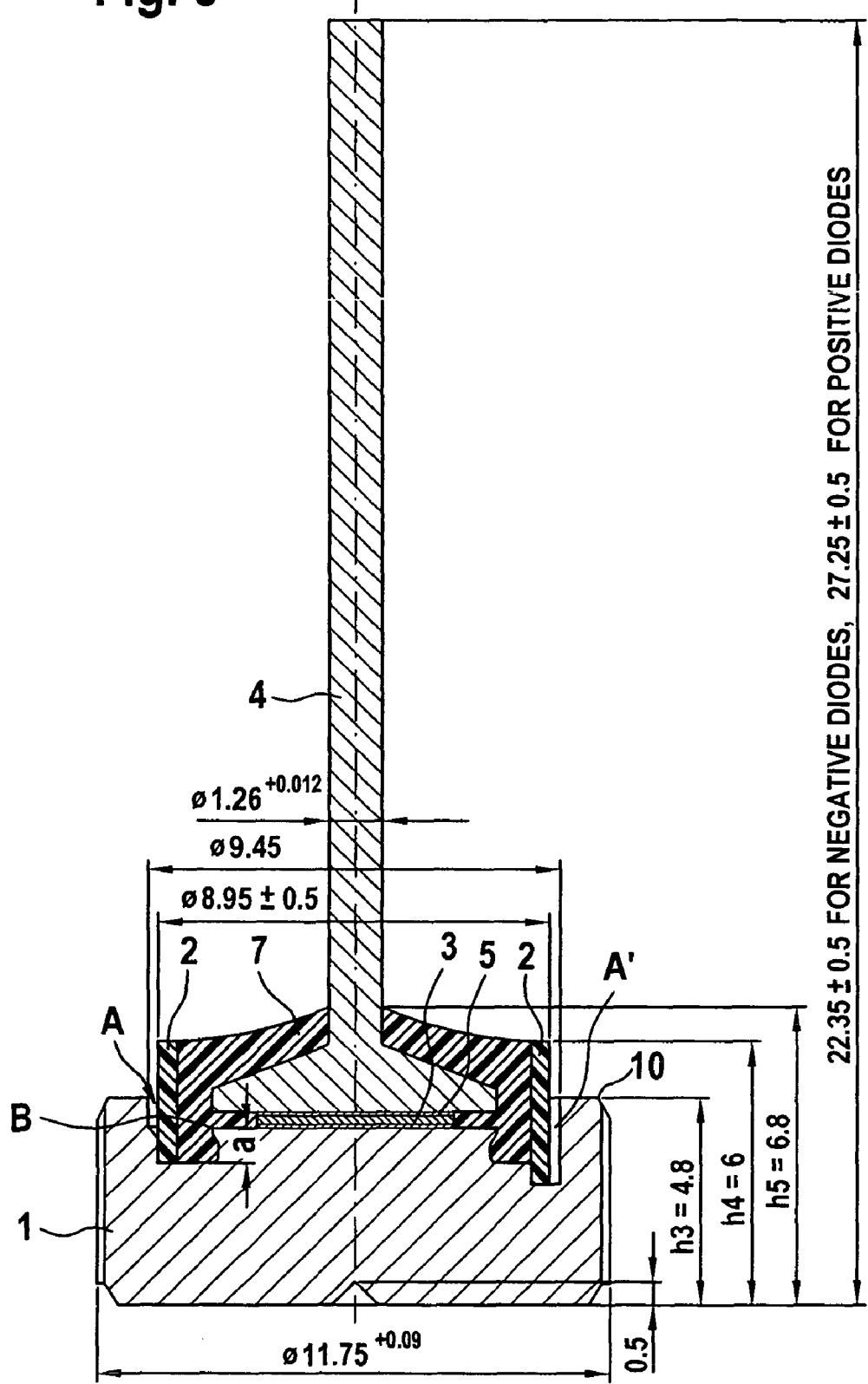

FIGS. 5 and 6 show additional exemplary embodiments of diodes according to the present invention. The individual components are identified by the same reference numerals as the exemplary embodiment according to FIG. 2.

In an embodiment illustrated on the right side of FIG. 5, the sleeve is clamped on its inner diameter, and the entire outer surface of the sleeve is kept contact-free. For this purpose, trench A' is made sufficiently deep to prevent contact between sleeve 2 and outer or edge area 10 of base 1. This prevents the transmission of force during press-fitting. The sleeve may also be glued and, if necessary, have an additional groove.

The exemplary embodiment according to FIGS. 6a through 6c also includes a notch F which is advantageous for the manufacture of the diodes and establishes, for example, a secure attachment during manufacture. In other respects, these exemplary embodiments differ only in terms of their dimensioning, which are illustrated in detail in the drawing.

Figure 7:
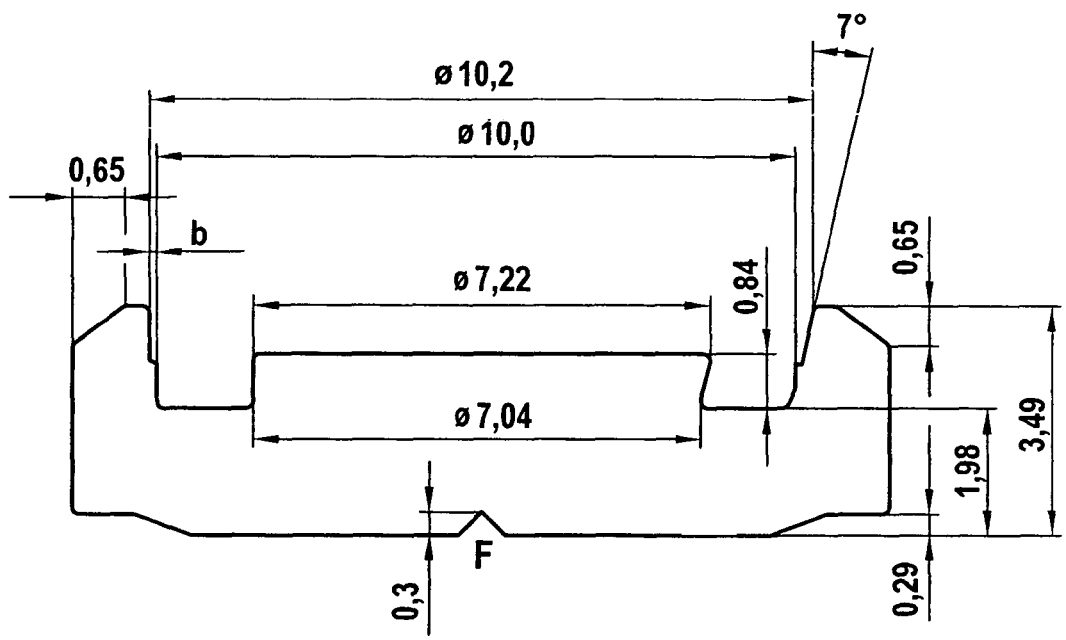
FIG. 7 shows structural details of the base in a further exemplary embodiment.
Figure 8A:
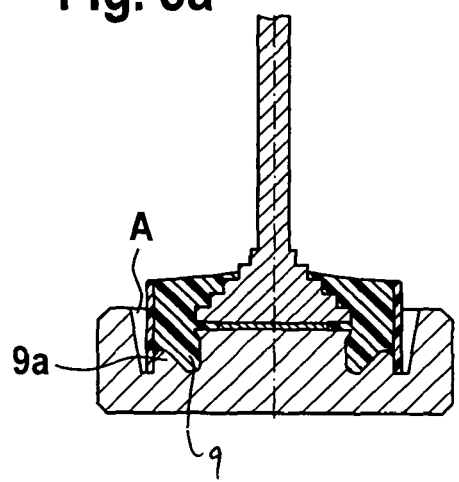
FIGS. 8a through 8f show additional example embodiments of diodes according to the present invention.
Figure 8B:
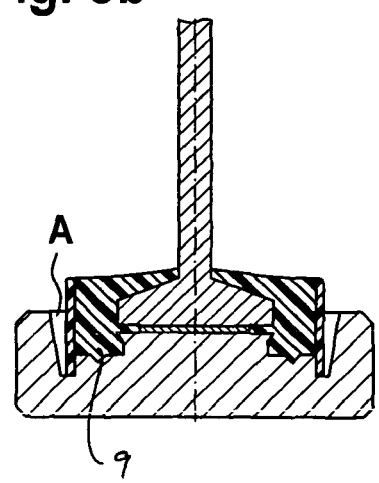
Figure 8C:
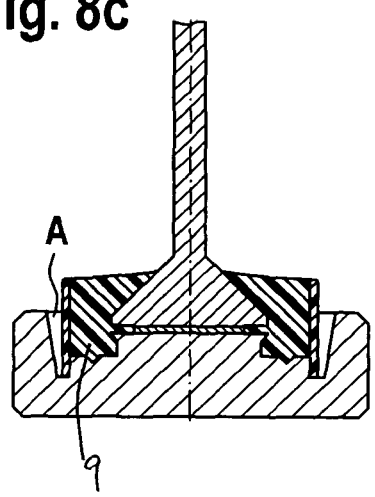
Figure 8D:
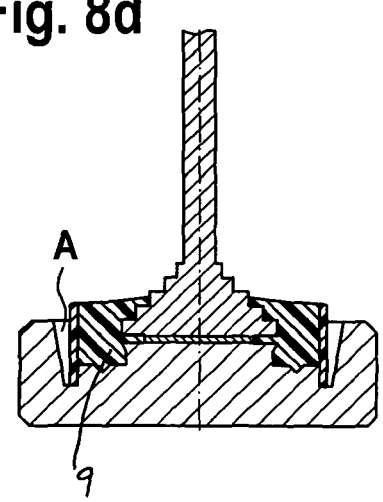
Figure 8E:
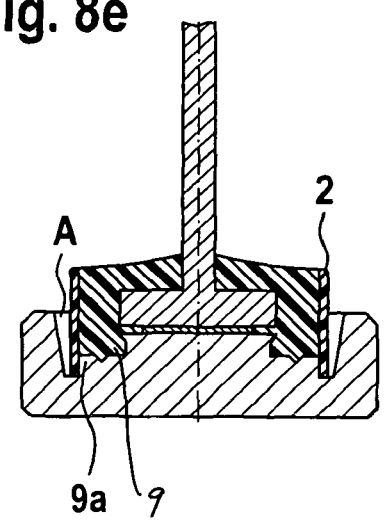
Figure 8F:
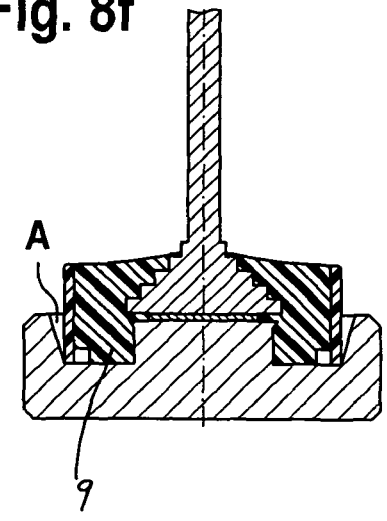

FIG. 7 shows another dimensioning of an example embodiment of a diode base.

FIGS. 8a through 8f show six additional embodiments of the present invention. In each case, gap A is provided with a v-shaped design, i.e., having a decreasing width b in the direction of the diode base.

Diode head or head wire 5 may be smooth or stepped, designed for example to have 2 to 6 steps. The angle of the head wire bevel is, for example, 20° or 50° or a value therebetween or a higher or lower value, it being possible to adjust this value to the requirements.

Depending on the embodiment, trench 9 has a smooth surface or is structured and includes, for example, a notch-shaped indentation. An elevation 9a of variable design is provided for attaching sleeve 2. In these exemplary embodiments, sleeve 2 may be secured during diode manufacture by selecting the inner diameter of sleeve 2 so that it is smaller than the outer diameter of elevation 9a. This fixes cylindrical sleeve 2 when it is press-fitted or mounted.

Gap A having a uniform diameter b or a v-shaped design in the embodiment is obtained by shaping inner edge area 10 of base 1 accordingly during the manufacture of the diode. Since the gap permits certain deformations, the problem of crack formation during press-fitting does not occur even in the case of a hard-cast diode. Furthermore, diodes of this type may be pressed into a rectifier from both sides.

The dimensions specified in the figures and description are suitable dimensions which may be varied within certain ranges. In particular, the maximum and minimum values indicate limits for possible value ranges.

What is claimed is:

1. A press-fit diode, comprising:
   a head wire;
   a base;
   a chip connected via solder layers to the head wire and to the base;
   at least a first bevel located at a top of a housing and a second bevel located at a bottom of the housing, wherein the first and second bevels enable press-fitting of the diode; and
   a plastic sheathing which includes a sleeve and is situated at least in an area around the chip and forms a mechanical connection between the base and the head wire, wherein the base at least partially encloses the plastic sheathing and forms the housing with the plastic sheathing, and wherein the base includes at least one undercut which extends into the plastic sheathing, and wherein a clearance space is provided outside the sleeve between the exterior of the sleeve and an outer region of an upper area of the base, the clearance preventing contact between the exterior of the sleeve and the outer region of the upper area of the base.

2. The press-fit diode as recited in claim 1, wherein the base is made of at least one of an electrically conductive material and thermally conductive material.

3. The press-fit diode as recited in claim 2, wherein a height of the base is selected to be between 0.5 mm to 0.8 mm to achieve an adequate clamping of the base and the head wire.

4. The press-fit diode as recited in claim 3, wherein the first and second bevels enable the diode to be pressed into a rectifier.

5. The press-fit diode as recited in claim 3, wherein the plastic sheathing in the area around the chip is made up of an area filled with a casting compound.

6. The press-fit diode as recited in claim 3, wherein the clearance space has a predetermined depth.

7. The press-fit diode as recited in claim 6, wherein the clearance space has a width which is approximately 0.1 mm in at least one area of the clearance space.

8. The press-fit diode as recited in claim 7, wherein the width of the clearance space is essentially uniform over the entire depth of the clearance space.

9. The press-fit diode as recited in claim 7, wherein the width of the clearance space is variable over the depth of the clearance space.

10. The press-fit diode as recited in claim 1, wherein the housing is made of at least one of an electrically conductive material and thermally conductive material.

* * * * *